(12) United States Patent
Har-Lev

(10) Patent No.: US 6,590,374 B1
(45) Date of Patent: Jul. 8, 2003

(54) TERMINATOR UNIT FOR WIRING NETWORKS

(76) Inventor: Yoram Har-Lev, Aba Hushi Street 48, Haifa (IL), 34781

(*) Notice: Subject to any disclaimer, the term of this patent is extended or adjusted under 35 U.S.C. 154(b) by 0 days.

(21) Appl. No.: 09/763,540

(22) PCT Filed: Sep. 1, 1999

(86) PCT No.: PCT/IL99/00473
§ 371 (c)(1),
(2), (4) Date: Mar. 14, 2001

(87) PCT Pub. No.: WO00/14556
PCT Pub. Date: Mar. 16, 2000

(30) Foreign Application Priority Data
Sep. 2, 1998 (IL) .................................................. 126048

(51) Int. Cl.[7] .......................... G01R 19/00; G01R 31/08
(52) U.S. Cl. ............................ 324/66; 324/67; 324/512
(58) Field of Search .............................. 324/66, 67, 115, 324/140 R, 415, 512, 525, 538; 439/620, 188, 507, 952

(56) References Cited

U.S. PATENT DOCUMENTS 5,029,274 A * 7/1991 Goff et al. .................... 324/66
5,108,294 A   4/1992 March et al. ............... 439/76.1
5,436,555 A   7/1995 Locke et al. ................... 324/66

FOREIGN PATENT DOCUMENTS

| DE | 41 27 440 C | 2/1993 | ........... G01R/31/02 |
| EP | 0 057 645 A | 8/1982 | ........... H01L/23/00 |
| EP | 0 521 391 A | 2/1993 | ......... H01R/13/645 |

* cited by examiner

*Primary Examiner*—N. Le
*Assistant Examiner*—John Teresinski
(74) *Attorney, Agent, or Firm*—Lowe Hauptman Gilman & Berner, LLP

(57) ABSTRACT

A terminator unit for use in wiring networks for naming wiring outlets, for verifying the normality of the wiring and for avoiding antenna effect, comprising a connector having a plurality of contacts, a first set and a second set of plurality of resistors. The resistors of the first set are connected each between one common point and a selected contact, such that a particular binary code is determined according to the particular combination of resistors connected to selected contacts. The resistors of the second set, suitable for avoiding antenna effect, are connected between one common point and each of the contacts. When the connector is joined to a matching outlet of the wiring, the particular binary code is remotely recognized through the wiring by sensing the resistors and the continuity of the wiring and the absence of short circuits are verified by measuring the resistors of the second set.

10 Claims, 2 Drawing Sheets

TERMINATOR UNIT FOR WIRING NETWORKS

BACKGROUND OF THE INVENTION

1. Field of the Invention

The present invention relates to a terminator unit for use in wiring networks. Plurality of said terminator units are connected to matching outlet connectors of a wiring network, performing an infrastructure for a scanning system for mapping the network and for identifying failures in the network. The said terminator unit and its corresponding scanning system are adapted for use in existing wiring networks without changing the wiring or connectors.

2. Description of the Related Art

The present invention will be described hereinafter as related to computer wiring networks, however computer network is only one example for its use wherein the same principal may be performed in a similar manner in any wiring network.

In large computer networks, the network configuration is often changed by users moving their computers (or other computer equipment) from place to place in the network. It is difficult to administrate such a network, to follow up its changing, and to control its use.

Furthermore, often changes of computer locations in the network, wear and damage the connectors and wiring, causing failures in the network.

Therefore, for the effective management of wiring networks of large computer systems, it is very important to have a recent configuration chart of the network, including data concerning the normality of each branch of the network. The effectiveness of management depends on the availability of an up-to-date network map. At present, mapping conventional computer network is done manually (i.e. checking separately each outlet connector). The present invention provides a convenient arrangement for automatically detecting and mapping (from a controlling center) the network structure and normality, and generating an up-to-date configuration chart (or map) of the network in an immediate availability.

Moreover, said automatic mapping arrangement improves the installation procedure of a new computer system on a wiring network, and may help in preventing unauthorized use of the network connections.

The purpose of the present invention is to provide means to:

(a) identify the location of connectors in a wiring network;

(b) verify the normality of each wiring branch of the network and the associate connectors;

(c) facilitate a controlled installation of a new system (e.g. computer net) on its wiring network.

(d) avoid antenna affect (of open-end wiring receiving and inducting Radio-Frequency interference) in vacant network branches.

(e) protect vacant connectors against harms.

SUMMARY OF THE INVENTION

The present invention relates to a series of terminator units for use in a scanning system for detecting the structure and normality (no short-circuit nor disruption in the connector and its associate wiring) of wiring networks and associate connectors.

The scanning system is comprised of a scanner located at a main branching point of the network, and plurality of terminator units are connected to matching outlet connectors of the network, providing a predetermined indication for each contact (pin) of the outlet connector, recognizable by said scanner.

In the context of the present invention:

The term "cold connection"—relates to the vacant connections of the network, which usually are wall connections ended by conventional outlet connectors.

The term "hot connection"—relates to those cold connections of the network which are presently occupied by connected equipment using the network.

The term "contact" relates to all types of electric conductor termination using in connectors for making the electrical contact with a matching connector.

The term "resistance element" relates to any type of element having recognizable impedance, such as a resistor, a diode (of other semi-conductor), a coil, a capacitor, or a combination thereof.

There are two types of terminator units: (a) terminator unit for use in cold connections (hereinafter called also "terminator"); (b) terminator unit for use in hot connections (hereinafter called also "outlet terminator"), which differs from the terminator by farther having an outlet for receiving a connector of an apparatus (for connecting it electrically to the wall outlet connector).

According to the preferred embodiment of the present invention, the series of terminator units each having a predetermined unique identifying code, is for use in wiring networks for the fulfillment of at least part of the following functions: (a) naming wiring outlets, (b) verifying the normality of the wiring and associate connectors, and (c) avoiding antenna affect of the wiring, wherein each terminator unit of the series is comprised of a connector having plurality of contacts for a connection with contacts of a matching wiring outlet connector, and at least one of a first set and a second set of plurality of resistance elements, wherein;

in each terminator included in the series, the resistance elements of the first set are for naming the network outlets, and are connected each between one common point and a selected contact, such that a unique identifying code is determined according to the particular combination of resistance elements connected to selected contacts, and said code is useful for distinguishing between the plurality of terminator units within the series, each having its own particular code according to its particular combination of resistance elements of the first set connected to selected contacts, and wherein;

the resistance elements of the second set in each terminator in the series are connected respectively between one common point and each of the contacts of the terminator;

such that when the two matching connectors are joined together, the unique identifying code is recognizable remotely through the wiring by sensing the combination of resistance elements of the terminator, the antenna affect of the wiring is avoided by the connection of the resistance elements of the second set, and the continuity of the wiring and the absence of short-circuits are verified by measuring the resistance elements of the second set remotely through the wiring.

In the context of the present invention, the term "plurality" when relates to resistance elements, does not come to exclude the few terminators having only one resistance element, which is the case when performing some particular binary codes (e.g. "01000000", "0000100" etc.)

It has to be noted that the present invention also relates to a series of terminator units each having a unique identifying code, for the fulfillment of only a part of the above mentioned functions, such as for use in wiring networks for naming wiring outlets (without verifying the normality of the network) comprising a connector having a plurality of contacts for a connection with contacts of a matching wiring outlet connector, and plurality of resistance elements wherein;

in each terminator included in the series, the resistance elements are connected each between one common point and a selected contact, such that a unique identifying code is determined according to the particular combination of resistance elements connected to selected contacts, and wherein;

said code is useful for distinguishing between the plurality of terminator units within the series, each having its own particular code according to its particular combination of resistance elements connected to selected contacts, such that;

when the two matching connectors are joined together, the unique identifying code is recognizable remotely through the wiring, by sensing the combination of resistance elements of the terminator.

According to one preferred embodiment of the present invention, the terminator unit for use in wiring network for naming wiring outlets, comprises a connector having plurality of contacts for a connection with contacts of a matching wiring outlet connector, and a plurality of resistance elements, wherein the resistance elements are connected each between one common point and a selected contact through an electrical switch allowing the resistance element to be switched on or switched off as selected by a user for determining a particular binary code such that a series of plurality of terminators each having a unique identifying code can be formed, the code is useful for distinguishing between the terminator unit and plurality of similar other terminator units each having its own particular code according to its particular combination of resistance elements connected to selected contacts.

According to one variation of the said preferred embodiment, the switches are separate items for switching on by insertion through orifices in a casing of the terminator.

According to other variations of said preferred embodiment, the terminator unit is further comprising indication means for pointing out the on-off status of each switch. Such indication means may be pointers connected to the switches, or a transparent casing of the terminator displaying the switches themselves which their on-off status is shown through the casing.

The present invention relates also to a terminator unit for use in wiring networks for verifying the normality of the wiring and associate connectors (without naming the wiring outlets), comprising a connector having plurality of contacts for a connection with contacts of a matching wiring outlet connector, and plurality of resistance elements (which may be also designed to be suitable for avoiding antenna affect), wherein;

the plurality of resistance elements are connected respectively between one common point and each of the contacts of the connector, such that;

when the two matching connectors are joined together, the continuity of the wiring and the absence of short-circuits are verified by measuring the resistance elements of the terminator remotely through the wiring.

The present invention claims also a terminator unit for use in wiring networks only for avoiding antenna affect of the wiring, comprising a connector having plurality of contacts for a connection with contacts of a matching wiring outlet connector and plurality of resistance elements, wherein;

the plurality of resistance elements are suitable for avoiding antenna affect and are connected respectively between one common point and each of the contacts of the connector, such that;

when the two matching connectors are joined together, a resistance suitable for avoiding antenna affect is connected between a common wire of the wiring and each of the network wires terminated by the terminator unit.

The present invention further relates to a method for automatically detecting and mapping wiring network structure and normality, and generating an up to date configuration chart of the wiring network in an immediate availability without changing the wiring or connectors, comprising the steps of;

(a) providing a plurality of wiring network outlets with a series of terminator units each having a predetermined unique identification code according to any of the proceeding claims such that each outlet has a particular identifying code;

(b) detecting the continuity of the wiring and absence of short circuits using a scanning system, by measuring resistance elements of the terminator remotely through the wiring;

(c) identifying each of the network outlets according to the specific terminator connected to it by using a scanning system; and (d) establishing a detailed map of the network using a computer.

DETAILED DESCRIPTION

Figure 1:
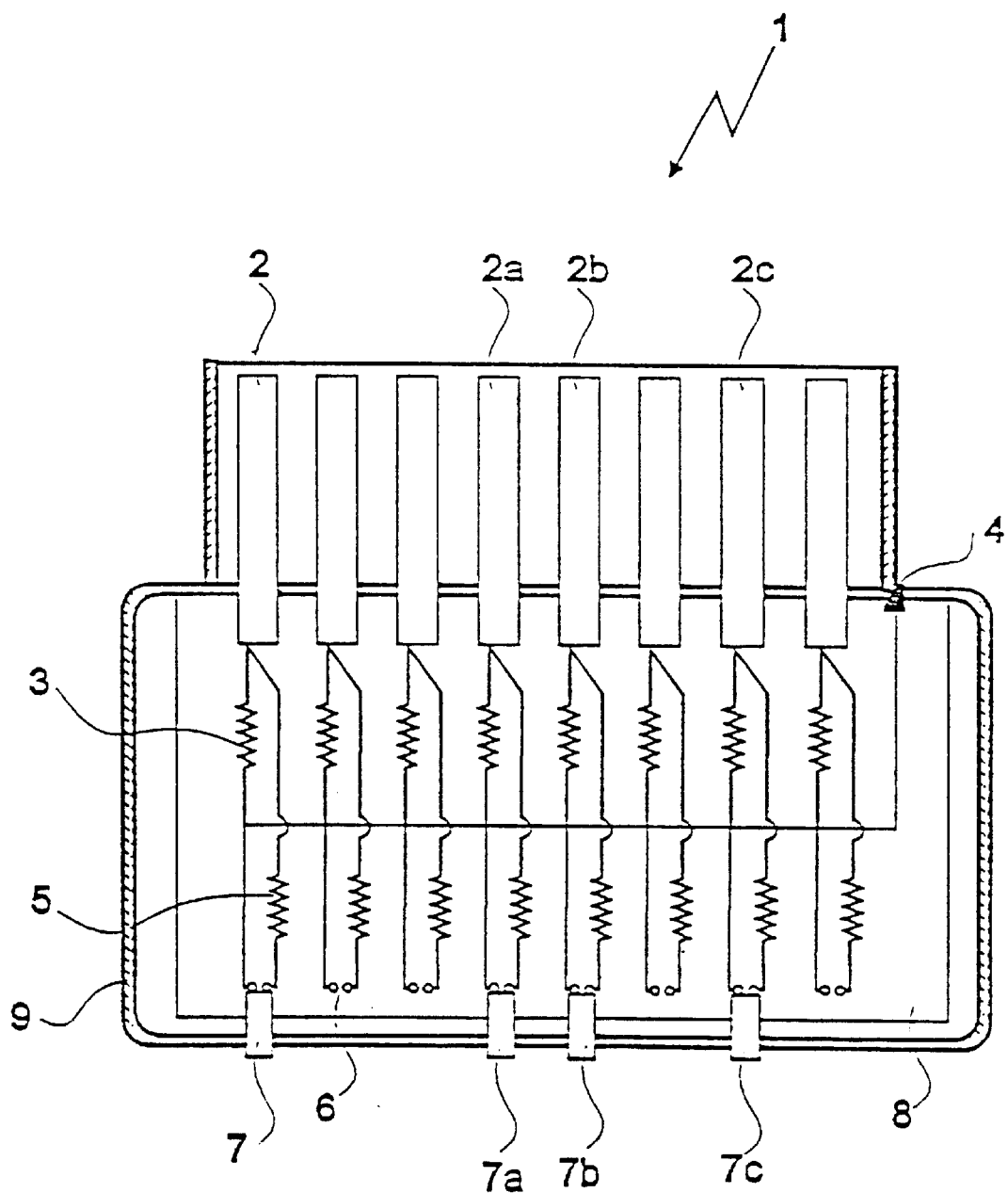
FIG. 1 illustrates a lateral cross section of a terminator according to an exemplary embodiment of the present invention.

The terminator unit is comprised of a connector having plurality of contacts for a connection with the contacts of a matching (wall connection) stationary connector, wherein a first set of resistance elements (for location identifying) is connected respectively between at least a part of the contacts and a first common point, and the location identification (using the second set of resistance elements) is achieved by predetermining a unique combination of resistance elements for each terminator unit, each combination represents a different binary code (i.e. for each connector contact: resistance presence means "1", resistance absence means "0"). The predetermination of the unique code for each terminator unit can be made either permanently during the manufacturing procedure, or by providing the terminator unit with resistance element for each contact, and with respective switches allowing the resistance elements to be switched on (for connecting a particular resistance) or switched off (for disconnecting a particular resistance), such that a known resistance is recognizable between the (first or second) common wire and each wire connected to a switched-on resistance.

The switches are turned on and off (by the user, or by the provider in advance) for forming a particular identification code for each particular connector.

Preferably, the terminator comprises indication means, for pointing out the on-off status of each switch. In case that the mechanical position of the switches is clearly indicates their electrical status, the indication means may be the switches themselves (seen through a transparent casing, or through a pointer connected to each switch for indicating the "on" and "off" positions on the terminator unit casing).

According to one embodiment, the switches are comprised of switching points and from protruding contacts located respectively in a body of the terminator unit and in a cover of the terminator unit, such that a contact is made between a protruding contact and a switching point when the cover is joined to the body.

According to another embodiment of the present invention, the switches are separate items, for switching on by plugging through orifices in the terminator casing. Thus, the indication for "on" status is a plugged (occupied) orifice.

According to the preferred embodiment of the present invention, a second set of plurality of resistance elements (for wiring detection) is connected respectively between one common point and each of the plurality of contacts of the connector, (according to one variation of the preferred embodiment of the present invention) or between the contacts and the said first common point (according to another variation of the preferred embodiment of the present invention), such that when the two corresponding connectors are joined together, a resistance is recognizable between the network common wire connected to the common point, and each of the other wires of the respective network branch. This resistance allow verifying (by scanning and reading the predetermined resistance value) the network continuity and the absence of short-circuits. According to the preferred embodiment this resistance element is also suitable for avoiding "antenna effect".

Figure 2:
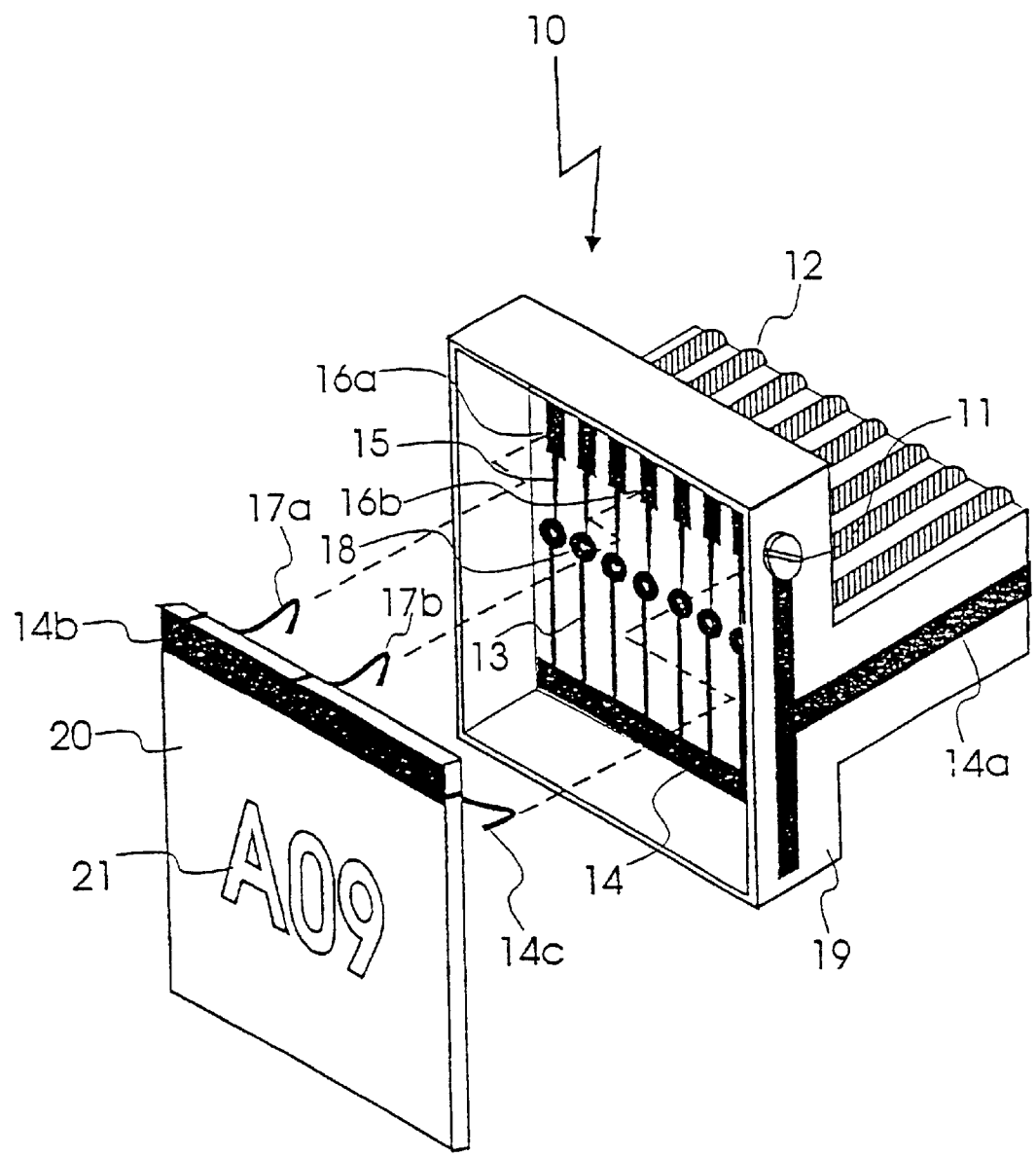
FIG. 2 illustrates an isometric view of another exemplary embodiment of a terminator according to the present invention.

The present invention will be further described by FIGS. 1–2.

These figures are solely intend to illustrate preferred embodiments of a terminator unit, and in no manner intend to limit the scope of the present invention.

FIG. 1 illustrates a lateral cross section of a terminator (1) according to an exemplary embodiment of the present invention. This terminator has eight contacts (2) for a connection with corresponding contacts of a network outlet connector. A resistor (3) is connected between a common point (4) and the contact (2), and the same is for each of the other seven contacts. In this embodiment, the common point is the shielding contact point of the network cable. Thus, a resistance is recognizable between each contact and the common point, and when the terminator is in position joined to a network outlet, said resistance is identified separately between each of the corresponding network wires and the shielding.

A resistor (5) of a second resistance set is connected from one side to the contact (2) and from the other side to a first contact of a switching point (6). A second contact of the switching point (6) is connected to the said common point (4) (shielding). The first and second contacts of the switching point (6) may be connected electrically by a plug-in switch (7) for connecting the second resistor (5) in parallel to the first resistor (3). In such a case, a lower resistance will be identified between the contact (2) and the shielding. (The same is for all the eight contacts). The second set of resistors (5) uses to provide a specific identification for each terminator unit, wherein each specific identification is a binary code formed by a different switching arrangement of the second set of resistors. In the illustrated eight contacts connector, 256 different binary combinations are available, thus 256 network outlets may be identified and checked in one scanner sequence.

In this figure, four plug-in switches (7)(7a)(7b)(7c) are connected forming the binary code "10011010". This code is recognizable by a scanner identifying a lower resistance between each of the contacts (2)(2a)(2b)(2c) and the shielding.

The resistors are built-in on a printed circuit board (8), and the plug-in switches are inserted and plugged on said circuit board, through matching orifices in the casing (9) of the terminator. The plugs are designed to slightly protrude from the orifices, thus the binary code is displayed and can be read out by eye, according to the protruding plugs.

FIG. 2 illustrates an isometric view of a terminator unit (10) comprising eight contacts (12) for contacting the contacts of a matching outlet connector of a wiring network. Each of the contacts (12) is connected to a junction point (18) located on a printed circuit board. A resistor (15) printed on the board is connected between the junction point and a switching point (16a), for making contact with a flexible contact (17a) located on the cover (20) of the terminator. Each terminator unit is provided by the manufacturer with flexible contacts according to its particular binary code. In the illustrated terminator two flexible contacts (17a)(17b) are provided, performing the particular binary code "00001001" (read from the right side to the left side of the illustrated terminator). On the terminator cover is printed the expression "A09" (21). The number "09" presents the decimal of the last four digits "1001" of the said binary code, for and the letter "A", presents (only as an example) the combination "0000" of the first four binary digits of said code. When the cover (20) is in position attached to the terminator body (19), the flexible contacts (17a)(17b) are connecting the respective resistors (15) to the common point through the switching points (16a)(16b), conductive strip (14b), and the flexible contact (14c) touching the screw (11). The common point is connected to a common wire of the wiring either through the shielding conductive strip (14a) and its associate in the matching outlet connector of the wiring, or through a special exterior wire connected between the screw (11) and a common point on the outlet connector (wherein according to this second possibility, the terminator is tied to the matching outlet by said exterior wire).

A second set of resistors (13) for verifying the normality of the network and for avoiding antenna affect), is connected respectively between the strip (14) (which is connected internally to the common point, by the screw (11)), and each of the contacts (12), through the junctions (18).

What is claimed is:

1. A series of terminator units each having a predetermined unique identifying code, said series is for use in wiring networks for naming wiring outlets, for verifying the normality of the wiring and associate connectors, and for avoiding antenna affect of the wiring, wherein each terminator unit of the series is comprised of a connector having a plurality of contacts for a connection with contacts of a matching wiring outlet connector, a first set and a second set of plurality of resistance elements, wherein;

in each terminator included in said series, the resistance elements of the first set are connected each between one common point and a selected contact, such that a unique identifying code is determined according to the particular combination of resistance elements connected to selected contacts, and said code is useful for distinguishing between the plurality of terminator units within said series, each having its own particular code according to its particular combination of resistance elements of the first set connected to selected contacts, and wherein;

the resistance elements of the second set in each terminator in the series are connected respectively between one common point and each of the contacts of the terminator.

2. A series of terminator units each having a unique identifying code, for use in wiring networks for naming wiring outlets, comprising a connector having plurality of contacts for a connection with contacts of a matching wiring outlet connector, and plurality of resistance elements wherein;

in each terminator included in said series, the resistance elements are connected each between one common point and a selected contact, such that a unique identifying code is determined according to the particular combination of resistance elements connected to selected contacts, and wherein;

said code is useful for distinguishing between the plurality of terminator units within the series, each having its own particular code according to its particular combination of resistance elements connected to selected contacts.

3. Terminator unit for use in wiring networks for naming wiring outlets, comprising a connector having plurality of contacts for a connection with contacts of a matching wiring outlet connector, and a plurality of resistance elements wherein;

the resistance elements are connected each between one common point and a selected contact through an electrical switch allowing the resistance element to be switched on or switched off as selected by a user for determining a particular binary code such that a series of plurality of terminators each having a unique identifying code can be formed, said code is useful for distinguishing between the terminator unit and plurality of similar other terminator units each having its own particular code according to its particular combination of resistance elements connected to selected contacts.

4. Terminator unit for use in wiring networks for naming wiring outlets according to claim 3, wherein the switches are comprised of switching points and from protruding contacts located respectively in a body of the terminator unit and in a cover of the terminator unit, such that a contact is made between a protruding contact and a switching point when the cover is joined to the body.

5. Terminator unit for use in wiring networks for naming wiring outlets according to claim 3, wherein the switches are separate items for switching on by insertion through orifices in a casing of the terminator.

6. Terminator unit for use in wiring networks for naming wiring outlets according to claim 3, further comprising indication means for pointing out the on-off status of each switch.

7. Terminator unit for use in wiring networks for naming wiring outlets according to claim 6, wherein the terminator has transparent casing and the indication means are the switches themselves which their on-off status is shown through the casing.

8. Terminator unit for use in wiring networks for naming wiring outlets according to claim 6, wherein the indication means are pointers connected to the switches.

9. Terminator unit for use in wiring networks for naming wiring outlets as defined in claim 3, further comprising a second set of resistance elements, for verifying the normality of the wiring and associate connectors or for avoiding antenna effect, said second set is connected to a connector having a plurality of contacts for a connection with contacts of a matching wiring outlet connector, and a plurality of resistance elements, wherein; the plurality of resistance elements are connected respectively between one common point and each of the contacts of the connector.

10. A method for automatically detecting and mapping wiring network structure and normality, and generating an up to date configuration chart of the wiring network in an immediate availability without changing the wiring or connectors, comprising the steps of;

(a) providing a plurality of wiring network outlets with a series of terminator units each having a predetermined unique identification code such that each outlet has a particular identifying code;

(b) detecting the continuity of the wiring and absence of short circuits using a scanning system, by measuring resistance elements of the terminator remotely through the wiring;

(c) identifying each of the network outlets according to the specific terminator connected to it by using a scanning system; and (d) establishing a detailed map of the network using a computer.

* * * * *